United States Patent

[11] 3,560,760

[72] Inventors David H. Chung;
Bill H. Terrell, Dallas, Tex.
[21] Appl No 007,356
[22] Filed Feb. 2, 1970
[45] Patented Feb. 2, 1971
[73] Assignee Texas Instruments Incorporated
Dallas, Tex.
a corporation of Delaware
Continuation of application Ser. No. 602,805, Dec. 19, 1966, now abandoned.

[54] LOGIC NAND GATE CIRCUITS
6 Claims, 2 Drawing Figs.

[52] U.S. Cl. .......... 307/215, 307/208
[51] Int. Cl. .......... H03k 19/36
[50] Field of Search .......... 307/213, 214, 215

[56] References Cited
UNITED STATES PATENTS

| | | | |
|---|---|---|---|
| 3,136,901 | 6/1964 | Yen | 307/215 |
| 3,229,119 | 1/1966 | Bohn et al. | 307/215X |

OTHER REFERENCES

Hurley, Transistor Logic Circuits, 10/61 TK-7872. T73 H86t (pgs. 166, 239, 240)

Atwood, IBM Technical Disclosure Bulletin, Vol. 8, No. 2, 7/65 (pgs. 317, 318)

Berding, IBM Technical Disclosure Bulletin, Vol. 6, No. 12, 5/64, (pg. 28)

*Primary Examiner*—Donald D. Forrer
*Assistant Examiner*—R. C. Woodbridge
*Attorneys*—Samuel M. Mims, Jr., James O. Dixon, Andrew M. Hassell, Harold Levine, Jack A. Kang, Henry K. Woodward, Robert J. Crawford and Richards, Harris and Hubbard

ABSTRACT: Disclosed are logic NAND gate circuits of the type capable of driving a low impedance or a high capacitance load while maintaining relatively fast propagation speed which include a pair of output transistors of one type respectively connected to bias voltage supplies and connected in common to an output circuit, and a plurality of input transistors connected between the bases of the output transistors. A logic 1 input signal at any one of the input transistors produces a logic 0 output signal.

INVENTORS:
DAVID H. CHUNG
BILL H. TERRELL
E. Mickey Hubbard
ATTORNEY

LOGIC NAND GATE CIRCUITS

This is a continuation of application Ser. No. 602,805, filed Dec. 19, 1966, now abandoned.

This invention relates generally to logic circuits, and more particularly relates to an improved NAND gate.

It is generally known that any logic function can be performed using one or more NAND gates, and many computers and other automated systems are built up using NAND gates exclusively. Perhaps the principal feature of merit of any computer or other automated system is speed. Of course, one of the limiting factors in achieving high speed operation is the propagation delay through each gate circuit. In many computer applications, the gates are called upon to drive either a low impedance or a highly capacitive load. Attempts to improve the driving capability of a gate, typically by the addition of a line driving capability emitter-follower stage, has heretofore resulted in significant increases in the propagation delays through the gates.

The present invention is concerned with an improved NAND circuit which is capable of driving a low impedance or a highly capacitive load while maintaining a very fast propagation speed. This is achieved by a logic gate circuit comprising first and second output transistors of the same type and an input transistor for each input to the gate. The emitter of the first output transistor and the collector of the second output transistor are common and form the output of the gate. The collectors and emitters of the input transistors are common and the collector is connected to the base of the first output transistor and the emitters are connected to the base of the second output transistor. A circuit means is provided for biasing all of the transistors to operate in the nonsaturated region. The first and second output transistors provide a bilateral charging path capable of rapidly charging and discharging a highly capacitive load. Further, the circuit is capable of operating into any load impedance, from an unloaded output down to any given minimum design impedance, with no change in the operating conditions. In addition, by simply connecting the outputs of two or more of the gate circuits together, another level of logic can be achieved. The circuit is relatively simple and can be fabricated in integrated circuit form using relatively simple, reliable and inexpensive commercial processes. Yet the gate has a very low propagation delay, typically on the order of 0.5 nanosecond.

Figure 2:
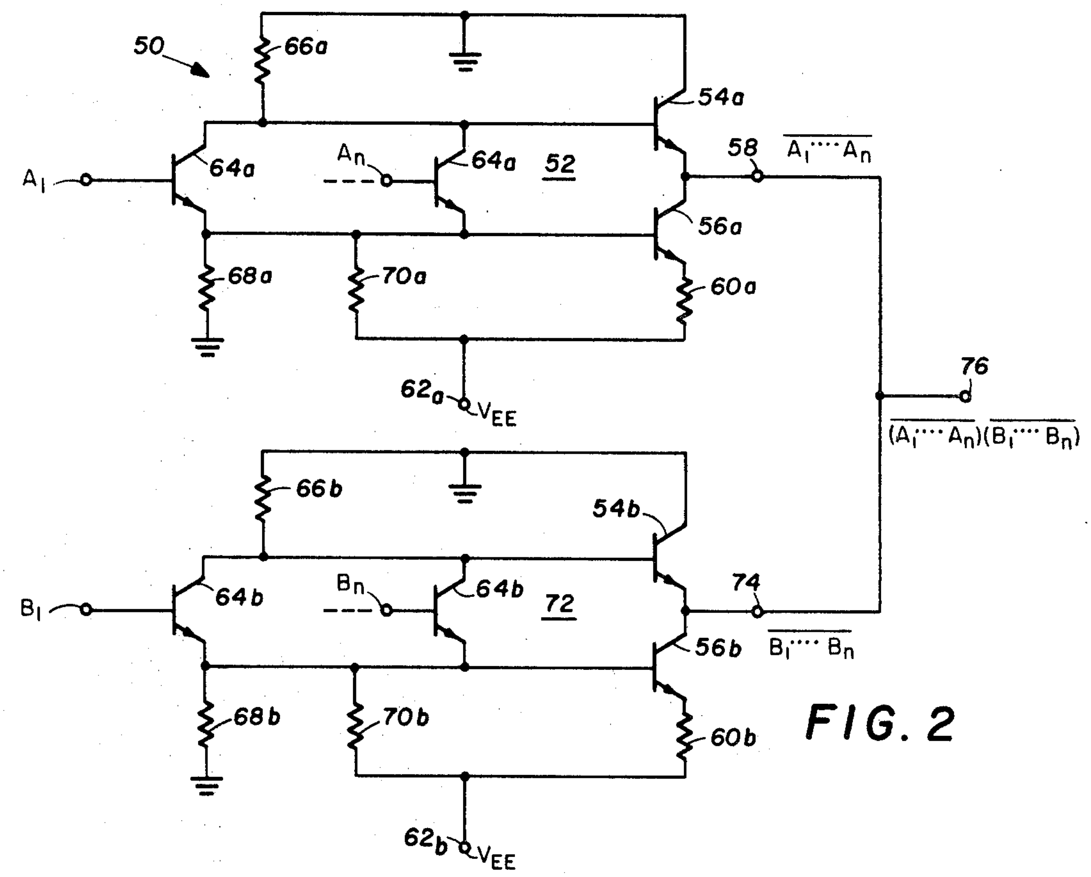
Figure 1:
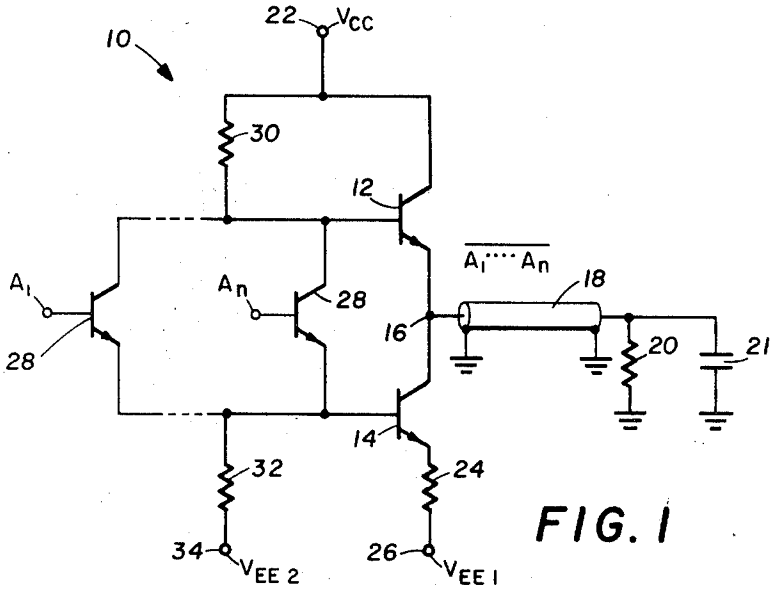

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

FIG. 1 is a schematic circuit diagram of a logic gate circuit constructed in accordance with the present invention; and FIG. 2 is a schematic circuit diagram of still another logic gate circuit constructed in accordance with the present invention.

Referring now to the drawings, and in particular to FIG. 1, a logic gate circuit constructed in accordance with the present invention is indicated generally by the reference numeral 10. The logic gate circuit 10 has first and second output transistors 12 and 14 which are of the same type, NPN transistors being illustrated. The emitter of the first output transistor 12 and the collector of the second output transistor 14 are electrically common and form the output 16 of the gate, which is illustrated as being connected through a transmission line 18 to a terminating load resistor 20 and a capacitor 21. The collector of the first output transistor 12 is connected to a collector voltage supply terminal 22. The emitter of the second output transistor 14 is connected through a resistance 24 to a first emitter voltage supply terminal 26. The gate 10 may have substantially any number of logic inputs which are represented by inputs $A_1$—$A_n$. An input transistor 28 is provided for each of the logic inputs $A_1$—$A_n$, each logic input being connected to the base of the respective input transistor. The collectors of all of the input transistors 28 are common and are connected to the base of output transistor 12. Similarly, the emitters of all of the input transistors are common and are connected to the base of output transistor 14. In addition, the collectors of the input transistors 28 are connected through a resistance 30 to the collector supply voltage terminal 22, and the emitters are connected through a resistance 32 to a second emitter voltage supply terminal 34. The collector voltage supply $V_{CC}$, the emitter voltage supplies $V_{EE1}$ and $V_{EE2}$, and the values of resistances 24, 30 and 32 are selected so that all of the transistors of the circuit are operated in the nonsaturated mode.

In operation, when all of the logic inputs $A_1$—$A_n$ of the circuit 10 are at a sufficiently low voltage level that the conductance of all of the input transistors 28 is at a relatively low level, transistor 12 will be at a relatively high conductance level and transistor 14 will be at a relatively low conductance level. The output 16 will then be at a relatively high logic level representative of a logic 1 condition. If any one, or more, of the inputs $A_1$—$A_n$ is raised to a logic 1 level, the conductance of the respective input transistor will be increased. As a result, the conductance of output transistor 12 will be decreased, the conductance of output transistor 14 will be increased, and as a result, the output 16 goes to a relatively low voltage level representative of a logic 0.

In practice, it is highly desirable for the output voltage levels representative of the logic 1 and logic 0 states to be the same as the input voltage levels representative of the logic 1 and logic 0 states to permit fan-out and fan-in of the gates without intermediate circuits. Thus, assume that the logic 1 level both at the inputs and at the outputs is to be +0.4 volt, and the logic 0 level both at the inputs and at the outputs is to be −0.4 volt. In order to maintain the output 16 at a logic 1 level of the +0.4 volt, the base of output transistor 14 and hence the collectors of all of the input transistors must be at about +1.2 volts, assuming that silicon transistors are used each having a $V_{BE}$ of about 0.8 volt. When the output 16 is at a logic 0 level of −0.4 volt, then the base of transistor 12 and hence the collectors of the input transistors must be at about +0.4 volt. Similarly, when all of the inputs are at a logic 0 level of −0.4 volt, then the common emitters of the input transistors, and hence the base of output transistor 14, must be at about −1.2 volts, and when any one of the inputs is at a logic 1 level of +0.4 volt, the common emitters of the input transistors and the base of output transistor 14 must be at about −0.4 volt. In this case, it would be evident that the collector supply voltage $V_{CC}$ would have to be at least as high as +1.2 volts, and preferably slightly higher, and that the emitter supply voltage $V_{EE2}$ would have to be at least as low as −1.2 volts, and preferably slightly lower. The values of the resistances 30 and 32 would then be selected such that when the input voltages are all at a logic 0 level of −0.4 volt, the base of transistor 12 is at +1.2 volts, and the base of transistor 12 is at −1.2 volts, and when any one, or more, of the logic inputs is at a logic 1 level of +0.4 volt, the base of transistor 12 will be at about +0.4 volt and the base of transistor 14 will be at about −0.4 volt. In addition, care is taken to insure that the collector-base junction of the input transistors 28 remains reverse biased and is not operated in the saturated mode. The value of resistor 24 is picked according to the minimum output impedance which the circuit 10 is to drive. For example, if the transmission line 18 has a 50 ohm characteristic impedance and terminating resistor 20 is 50 ohms, it will be noted that a current of about 8 milliamperes must be passed through the load resistor 20 in order to establish the logic 1 level of +0.4 volt at output 16, and that transistor 14 must sink a current of about 8milliamperes in order to establish the logic 0 level of −0.4 volt. Thus, if the circuit 10 is to be designed to drive a minimum load of 50 ohms, then resistor 24 would be selected so as to establish a potential of about −2.0 volts at the emitter of transistor 14 when passing only the idle current of transistor 14 necessary to maintain transistor 14 operating in the nonsaturated region, and a potential of about −1.2 volts when transistor 14 is in the higher conductance state and is sinking the 8 milliamperes from the load 20, plus the base current from transistor 14 and any idle current from transistor 12.

From the foregoing discussion, it will be noted that the circuit 10 has a bilateral output to drive the load with either a positive or negative current. Further, the circuit can drive either a very low impedance or a relatively high capacitance load without significant loss in propagation speed. In addition, the circuit 10 can drive a very high output impedance, including an open circuit, without changing either the input or the output voltage levels. As the output impedance is raised, any tendency for voltage at output 16 to rise tends to back bias the emitter of transistor 12 so that the current through transistor 12 is reduced, thus maintaining the output voltage substantially constant. On the other hand, when the output is at logic 0 and the current from the load which passes through transistor 14 is reduced, the potential of the emitter of transistor 14 will tend to lower. This tends to cause transistor 14 to conduct more heavily which tends to lower the potential of the output 16 and hence the emitter of transistor 12. As a result, additional current is supplied by transistor 12 to maintain the output 16 substantially at the logic 0 voltage level. Thus, it will be noted that the voltage at output 16 is controlled primarily by the voltage across the input transistors 28, and this voltage is essentially independent of the load driven by the output 16.

Another gate circuit constructed in accordance with this invention is indicated generally by the reference numeral 50 in FIG. 2. THe circuit 50 is comprised of first and second NAND gates indicated generally by the reference numerals 52 and 72, respectively. Each of the gates 52 and 72 is substantially identical to the NAND gate 10, except that only one voltage supply $V_{EE}$ is used. The NAND gate 52 is comprised of first and second output transistors 54a and 56a. The emitter of transistor 54a is common with the collector of transistor 56a and is connected to the output terminal 58. The collector of output transistor 54a is connected to ground, and the emitter of output transistor 56a is connected by a resistor 60a to an emitter voltage supply terminal 62a. The gate 52 has one or more logic inputs represented by inputs $A_1$—$A_n$, each of which is the base of an input transistor 64a. The collectors of all of the input transistors are common with the base of output transistor 54a, and the emitters of all of the input transistors are common with the base of output transistor 56a. The collectors of the input transistor 64a are connected through a resistor 66a to ground, and the emitters are connected by a resistance 68a to ground, and by a resistor 70a to the emitter voltage supply terminal 62a. Thus, resistors 68a and 70a form a voltage divider between ground and the emitter voltage supply terminal 62a, and in effect form an emitter supply voltage for the input transistors. The second NAND gate indicated generally by the reference numeral 72 has an output terminal 74 and a plurality of input terminals $B_1$—$B_n$. The NAND gate 72 is identical to the NAND gate 52 and accordingly will not be described in detail. However, corresponding components are designated by corresponding reference numbers followed by the character *b*, rather than the character *a*. Outputs 58 and 74 are electrically common to provide a common output 76. If desired, outputs 58 and 74 can be interconnected by transmission lines (not illustrated) and the output 76 can be connected to drive any desired load.

The operation of NAND gates 52 and 72 is substantially identical to the operation of NAND 10 heretofore described. Thus, so long as all of the inputs $A_1$—$A_n$ are at a logic 0 level, the output 58 will tend to be at a logic 1 level. However, if any one of the inputs $A_1$—$A_n$ is at a logic 1 level, then output 58 will tend to be at a logic 0 level. Similarly, if all of the inputs $B_1$—$B_n$ of NAND gate 72 are at a logic 0 level, then output 74 tends to be at a logic 1 level. If any one of the inputs $B_1$—$B_n$ is at a logic 1 level, then output 74 tends to be at a logic 0 level. However, since the outputs 58 and 74 of NAND gates 52 and 72 are electrically common, both outputs 58 and 74 must be at a logic 1 level in order to provide a logic 1 level at the common output 76. This condition requires that all inputs $A_1$—$A_n$ and $B_1$—$B_n$ be at a logic 0 level. In this condition, each of the transistors 54aand 54btends to supply full current to the load driven by the output 76 As a result, the potential at output 76 tends to rise, thus tending to back bias the emitters of output transistors 54a and 54b and maintaining the voltage at the output 76 at the desired logic 1 output level.

If any one of the inputs $A_1$—$A_n$ is at a logic 1 level, then transistor 56a will sink current both from the load and from output transistor 56b, assuming all inputs $B_1$—$B_n$ are at a logic level. Any tendency for the potential of the emitter of transistor 56a to rise as a result of increased current through resistor 60a tends to reduce the current through transistor 54b as heretofore described in connection with driving an impedance greater than the design impedance. As a result, the common output 76 will be maintained at the logic 0 level.

Thus, it will be noted that the inherent capability of the basic NAND circuit 10 to drive heavy loads or high impedance loads with a bilateral current also permits two or more of the NAND gates to be combined to form a composite NAND gate merely by wiring the outputs together, and this can be achieved without a major reduction in the speed of operation of the circuit. A typical propagation speed through a NAND gate constructed in accordance with the present invention is about 0.5 nanosecond. Also, since the circuit is formed entirely by the same type of transistors, it can be easily fabricated using standard integrated circuit technology.

Although preferred embodiments of the invention have been described in detail, it is to be understood that various changes, substitutions and alterations can be made therein without departing from the spirit and scope of the invention as defined by the appended claims.

We claim:

1. A logic gate circuit of the type capable of driving a low impedance or a high capacitive load while maintaining relatively fast propagation speed, comprising in combination:

a. first and second output transistors of the same type wherein the emitter of said first output transistor is electrically common with the collector of said second output transistor and form the output of said logic gate circuit; and
b. at least one input transistor in which:
   1. the collector is common with the base of said first output transistor,
   2. the emitter is common with the base of said second output transistor, and
   3. the base forms a logic input for the logic gate circuit; and wherein
c. the collector of the first output transistor is connected to a collector supply voltage terminal; and wherein
d. the collector of each input transistor is connected to said collector supply voltage terminal through a resistance; and wherein
e. the emitter of each input transistor is connected to said collector supply voltage terminal and to an emitter supply voltage terminal through respective resistances; and wherein
f. the emitter of said second output transistor is connected to said emitter voltage supply terminal through a resistance; whereby
g. said collector and emitter voltage supplies bias said transistors such that each operates in a nonsaturated mode.

2. The logic gate circuit of claim 1 wherein:

a. at least two of said logic gate circuits are combined to have their output circuits connected in common to a system output circuit so as to form a composite logic gate circuit; whereby
b. when a logic 0 input signal is applied to all of said input transistors of said logic gate circuits, a logic 1 output signal is produced in said system output circuit, and when a logic 1 input signal is simultaneously applied to any one input transistor of each of said logic gate circuits, a logic 0 output signal is produced in said system output circuit.

3. The logic gate circuit of claim 1 wherein at least three input transistors are provided.

4. A logic NAND gate circuit of the type capable of driving a low impedance or a high capacitive load while maintaining relatively fast propagation speed, comprising in combination:

a. a collector voltage supply, first and second emitter voltage supplies, and a third voltage supply;

b. a plurality of input circuits and an output circuit;

c. first and second output transistors of one type wherein:

1. the emitter of said first transistor and the collector of said second transistor are connected together and connected to said output circuit;

2. the collector of said first output transistor is connected to said collector voltage supply;

3. the emitter of said second transistor is connected to said first emitter voltage supply through a resistance; and 4. the bases of said first and second transistors are respectively connected to said collector and second emitter voltage supplies through respective resistances;

d. said output circuit is connected to said third voltage supply; and e. a plurality of input transistors of said one type each having its collector connected to the base of said first transistor, its emitter connected to the base of said second transistor, and its base connected to a respective input circuit; wherein f. said third voltage supply has a value between said collector voltage supply and said emitter voltage supplies, and said collector, first and second emitter, and said third voltage supplies are preselected so that said first, second and input transistors are operating in the nonsaturated mode; and wherein g. the bases of said input transistors form a logic input for said NAND gate circuit, whereby when a logic 1 input signal is applied to any one of said input transistors through its respective input circuit, a logic 0 output signal is produced in said output circuit.

5. The logic NAND gate circuit of claim 4 wherein:

a. at least two of said NAND gate circuits are combined to have their output circuits connected in common to a system output circuits connected in common to a system output circuit so as to form a composite NAND gate circuit; whereby b. when a logic 1 input signal is applied to any one of said input transistors of one of said NAND gate circuits, and at the same time a logic 1 input signal is applied to any one of said input transistors of the other of said NAND gate circuits, a logic 0 output signal is produced in said system output circuit.

6. The logic gate circuit of claim 4 wherein at least three input transistors are provided.